(12) United States Patent
Rano et al.

(10) Patent No.: US 11,510,288 B2
(45) Date of Patent: Nov. 22, 2022

(54) GLASS SUBSTRATE PROVIDED WITH COPPER-BASED CONDUCTIVE STRIPS

(71) Applicant: SAINT-GOBAIN GLASS FRANCE, Courbevoie (FR)

(72) Inventors: Simon Rano, Courdimanche (FR); Clément Briquet, Elincourt Sainte Marguerite (FR); André Beyrle, Tracy le Val (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 15/536,837

(22) PCT Filed: Dec. 15, 2015

(86) PCT No.: PCT/FR2015/053508
§ 371 (c)(1),
(2) Date: Jun. 16, 2017

(87) PCT Pub. No.: WO2016/097579
PCT Pub. Date: Jun. 23, 2016

(65) Prior Publication Data
US 2017/0347403 A1    Nov. 30, 2017

(30) Foreign Application Priority Data

Dec. 18, 2014   (FR) ...................... 1462758

(51) Int. Cl.
*H05B 3/84* (2006.01)
*C03C 17/00* (2006.01)
(Continued)

(52) U.S. Cl.
CPC ......... *H05B 3/84* (2013.01); *B32B 17/10348* (2013.01); *B32B 17/10385* (2013.01);
(Continued)

(58) Field of Classification Search
CPC ............... H05B 3/84; B32B 17/10348; B32B 17/10385; C03C 17/008; C03C 17/3644;
(Continued)

(56) References Cited

U.S. PATENT DOCUMENTS 2,777,044 A * 1/1957 William .................. F24C 7/043
219/220
3,813,519 A * 5/1974 Jochim ................... B41F 15/08
101/126

(Continued)

FOREIGN PATENT DOCUMENTS

CN        201397399 Y    2/2010
EP       0 065 857 A2   12/1982
(Continued)

OTHER PUBLICATIONS

Machine translation of FR 2841432 performed Apr. 13, 2018.*
(Continued)

*Primary Examiner* — Tu B Hoang
*Assistant Examiner* — Alba T Rosario-Aponte
(74) *Attorney, Agent, or Firm* — Pillsbury Winthrop Shaw Pittman LLP

(57) ABSTRACT

A glazing includes at least one glass sheet provided on one of the faces with an electrical network having resistance strips and collector strips, in which at least one portion of one face includes at least one strip obtained from an electrically conductive composition including a silver paste, the strip being in contact with another strip obtained from an electrically conductive composition including a copper
(Continued)

paste, the other strip obtained from an electrically conductive composition including a copper paste being completely covered with a protective enamel layer.

11 Claims, 2 Drawing Sheets

(51) Int. Cl.
  *C03C 17/36*   (2006.01)
  *B32B 17/10*   (2006.01)
  *H05K 1/03*   (2006.01)
  *H05K 1/09*   (2006.01)
  *H05K 3/28*   (2006.01)
  *H05K 3/12*   (2006.01)

(52) U.S. Cl.
  CPC ........ *C03C 17/008* (2013.01); *C03C 17/3644* (2013.01); *C03C 17/3649* (2013.01); *C03C 17/3673* (2013.01); *C03C 17/3681* (2013.01); *H05K 1/0306* (2013.01); *H05K 1/09* (2013.01); *H05K 3/28* (2013.01); *B32B 2307/202* (2013.01); *B32B 2309/105* (2013.01); *C03C 2218/119* (2013.01); *H05B 2203/011* (2013.01); *H05B 2203/013* (2013.01); *H05B 2203/016* (2013.01); *H05B 2203/017* (2013.01); *H05K 3/1216* (2013.01); *H05K 3/1275* (2013.01)

(58) Field of Classification Search
  CPC ............ C03C 17/3649; C03C 17/3673; C03C 17/3681; H05K 1/0306; H05K 1/09; H05K 3/28
  USPC .......................................... 219/203, 202, 522
  See application file for complete search history.

(56) References Cited

U.S. PATENT DOCUMENTS

| | | | | | |
|---|---|---|---|---|---|
| 4,450,346 | A | * | 5/1984 | Boaz | H05B 3/84 219/203 |
| 4,453,669 | A | * | 6/1984 | Karla | H05B 3/84 165/43 |
| 4,637,862 | A | * | 1/1987 | Eesley | C23C 18/14 205/109 |
| 5,902,505 | A | * | 5/1999 | Finley | C03C 17/36 219/203 |
| 5,911,899 | A | * | 6/1999 | Yoshikai | H05B 3/86 219/451.1 |
| 2013/0186875 | A1 | * | 7/2013 | Lisinski | H05B 3/84 219/203 |

FOREIGN PATENT DOCUMENTS

| | | | | |
|---|---|---|---|---|
| FR | 1 544 718 A | | 11/1968 | |
| FR | 2841432 A1 | * | 12/2003 | ............ C03C 17/36 |
| WO | WO 2005/068385 A1 | | 7/2005 | |
| WO | WO 2006/134356 A2 | | 12/2006 | |

OTHER PUBLICATIONS

International Preliminary Report on Patentability and the Written Opinion of the International Searching Aurhority as issued in International Patent Application No. PCT/FR2015/053508, dated Jun. 20, 2017.

International Search Report as issued in International Patent Application No. PCT/FR2015/053508, dated Mar. 18, 2016.

* cited by examiner

GLASS SUBSTRATE PROVIDED WITH COPPER-BASED CONDUCTIVE STRIPS

CROSS-REFERENCE TO RELATED APPLICATIONS

This application is the U.S. National Stage of PCT/FR2015/053508, filed Dec. 15, 2015, which in turn claims priority to French patent application number 1462758 filed Dec. 18, 2014. The content of these applications are incorporated herein by reference in their entireties.

The present invention relates to the field of glass substrates on which copper-based conductive strips are deposited by screen printing. These substrates especially find applications in the motor vehicle field and more particularly for heated glazing.

In the current processes for screen printing onto glass, the conductive wires are made from a silver-based enamel. This enamel contains at least one resin, glass frit, micrometer-sized silver crystals, powders and/or flakes and at least one solvent. It is in the form of a paste having a certain viscosity, which enables it to be generally screen printed onto the substrate with the aid of a screen. Once deposited, the enamel is subsequently dried at 150° C. approximately and then fired in air at a temperature between 550° C. and 700° C. for a duration that varies from 2 to 10 minutes. The enamel thus fired is in solid form. Contact terminals may be welded to enable the conductive wires to be supplied with electrical power. This process is usually integrated into the process for forming the glass. The silver-based conductive wires thus formed conventionally have a thickness of between 3 and 30 μm.

In the glazings having a heating network, a series of narrow resistance strips (also referred to as "tracks") are screen printed onto the surface of a glass sheet, before the bending and/or toughening operations, so that the firing of the electrically conductive composition takes place during these forming operations. The electrically conductive composition is made from a pasty suspension of metallic silver and a frit (i.e. a glass with a low melting point) in an organic binder. These resistance strips open into wider collector strips, located close to the edges of the glazing. These collector strips, also referred to as busbars, are generally made from a composition identical to that of the resistance strips and are deposited at the same time and in the same way. The current leads are then welded to these collector strips. The manufacturers require these collectors not to exceed a certain temperature, which requires having relatively large widths and also sufficient thicknesses and consequently necessitating relatively large amounts of silver. Silver is a quite rare and speculative metal. Today, its price per kilo lies in the vicinity of 450€ but it has been known to rise up to 850€, for example in 2012. The price of the conductive paste is directly linked to the price of a silver since this component is the essential constituent. Indeed, an enamel paste based on silver comprises between 60% and 88% by weight of silver. It is therefore sought to limit the amount of silver and the objective of the present invention is to completely or partially replace the silver with another metal that is less expensive but that has good conductive properties. Silver also has the property of withstanding treatments at high temperature. During the forming of a glazing, the paste is fired at a temperature of 550° C. to 630° C. for a laminated glass and at a temperature of 610° C. to 700° C. for a toughened glass. Moreover, the conductive wires must be able to provide heating for at least 10 years, the minimum service life of a vehicle, while being subjected to corrosion and also to large temperature variations that may range typically from −40° C. to 105° C. It is consequently necessary to replace the silver with a metal that withstands these same conditions.

Copper is a cheap metal (cost of less than 10€ per kilo) which has excellent conduction properties comparable to silver, but which are in no way guaranteed over time when it is exposed to ambient air. Moreover, copper is a metal having virtually no corrosion resistance properties when the temperature exceeds 300° C., or when it is placed in an acidic or basic environment. Although copper pastes are used very commonly in the electronics sector, for example for printed circuits or ceramic capacitors, they are systematically fired in an inert, or even reducing, atmosphere for periods of around 20 minutes. In the motor vehicle or construction field, when the glass panels used are of large size and require a particular forming operation, it cannot be envisaged to use furnaces having a controlled atmosphere, especially for cost reasons.

The present invention proposes a glazing comprising conductive wires or electrical collectors based on copper, that withstand high temperatures and corrosion, and also the process for manufacturing such a glazing.

The glazing according to the invention comprises at least one glass sheet provided on one of the faces with an electrical network consisting of resistance strips and collector strips, in which at least one portion of one face comprises at least one strip obtained from an electrically conductive composition comprising a silver paste, said strip being in contact with another strip obtained from an electrically conductive composition comprising a copper paste, said other strip obtained from an electrically conductive composition comprising a copper paste being completely covered with a protective enamel layer.

The strips comprising the electrically conductive composition based on copper paste are covered with an enamel layer, providing protection against oxidation and corrosion. The enamel is a paste comprising a glass frit, optionally inorganic pigments and a medium often based on resin and solvent enabling the inorganic particles present to be suspended and enabling processability in the liquid state. The inorganic pigment used frequently in the motor vehicle field is a black pigment based on chromium-copper or copper spinets, copper-manganese spinets or even iron-manganese spinets. The medium is consumed during the firing of the enamel and the glass frit will make it possible to ensure the attachment to the substrate and a good mechanical strength of the enamel. The enamel used to cover the electrically conductive composition based on copper paste is an enamel rich in glass frit, and optionally colorless: it contains more than 50% by weight of glass frit, and from 0 to 30% of pigment. Advantageously, the content of pigment in this protective enamel is less than or equal to 15% by weight. The strip which is obtained from the electrically conductive composition based on copper must benefit from complete protection by the enamel layer. The upper and lateral portions of this strip must be protected.

The contact between the two conductive strips, one obtained from a composition based on copper paste and the other from a composition based on a silver paste, is made at the ends of the strip based on copper paste. Indeed, if the copper strip is completely covered by an enamel layer, it becomes electrically inaccessible. It is necessary that at least one contact is made between the copper strip and the silver strip before the copper strip is completely encapsulated in the enamel layer.

Advantageously, the protective enamel layer covers the whole of the copper strip and a portion of the silver strip.

According to one embodiment of the glazing according to the invention, in order to ensure a good contact between the two strips made of different material, the strip obtained from the electrically conductive composition comprising the silver paste is partially covered by the strip obtained from the electrically conductive composition comprising the copper paste. The protective enamel layer that covers the copper strip therefore also partially covers the silver strip. The contact zone between the copper and the silver is thus covered by the protective enamel layer. This embodiment makes it possible to protect the copper over the whole of its surface and to mask the interface between the two strips, which may be subject to visual defects due to the intermigration of the silver and of the copper.

According to another embodiment, the silver strip may partially cover the copper strip.

According to an embodiment of the glazing according to the invention, the silver strip and/or the copper strip may be positioned on an enamel layer deposited on the glass sheet. Thus, the strips are completely masked and are no longer visible. The presence of this enamel layer deposited on the glass sheet advantageously enables a better adhesion of the strips obtained from the electrically conductive pastes. The composition of this enamel layer deposited directly on the glass sheet may be identical to or different from the composition of the protective enamel layer.

The electrically conductive composition comprising the copper paste comprises between 70% and 90% by weight of copper powder. The glass frit content of this composition is advantageously less than 15% by weight. Although the copper strip is not in direct contact with the glass sheet but is deposited on an enamel layer as described above, it can be envisaged that the electrically conductive composition comprising the copper paste is free of glass frit.

The electrically conductive composition comprising the copper paste also comprises between 10% and 20% of medium, which will also be consumed during the heat treatments.

The electrically conductive composition comprising the silver paste comprises between 70% and 90% by weight of silver powder. The glass frit content of this composition is advantageously less than 15% by weight.

The thicknesses of the various layers are measured on the finished product, after drying and firing of the enamel or of the pastes used. The thickness of the copper strip is between 5 and 50 μm and preferably between 5 and 30 μm.

The protective enamel layer covering the strip comprising the copper paste has a thickness, measured after firing, of between 5 and 40 μm, preferably between 10 and 30 μm.

A portion of at least one of the faces of the glazing according to the invention comprises collector strips and/or resistance strips that are obtained from the electrically conductive composition based on copper paste and that are covered with the protective enamel layer.

Preferably, the copper resistance strips are directly deposited on the glass sheet and are covered with a pigment-free protective enamel layer.

The glazing according to the present invention may be a toughened glass or a laminated glass. In the case of a toughened glass, the face of the glass sheet comprising the electrical network will be the inner face of the glass sheet. In the case of a laminated glass comprising at least two glass sheets, the faces comprising the electrical network are preferably the faces 2, 3, or 4 if face 1 is considered to be the exterior face of the vehicle.

The present invention also relates to a process for manufacturing a glazing as described above. The process comprises the following steps:

depositing a layer of silver paste on at least one portion of at least one of the faces of the glass sheet in order to form a strip, depositing a layer of copper paste in order to form another strip, the deposition steps being carried out so that there is at least one contact zone between the two layers, then depositing a protective enamel layer over the whole of the layer of copper paste, and firing all of the layers deposited at a temperature of between 550° C. and 700° C., in air, for a duration of from 2 to 10 minutes.

The steps of depositing the layers of silver paste and layer of copper paste may be carried out in any order. Preferably, the steps of depositing the various layers are carried out by screen printing. Screen printing is a well-known deposition technique that uses a screen-printing screen consisting of a fabric on which the pattern to be printed is reproduced and a doctor blade allowing enough shear force to be applied to make the pasty composition pass through the meshes in the screen by the openings corresponding to the pattern to be printed, and thus to deposit the pasty composition on the support. The screen-printing screen must have a mesh size compatible with the size of the particles contained in the paste compositions. The filaments forming the screen may be steel filaments or filaments made of a polymer material, for example made of polyester. The number of filaments per centimeter varies in general from 34 to 200 and their diameter varies between 27 and 100 μm.

Subject to rheological and particle size limits of the paste to be deposited, it is also possible to envisage the steps of depositing the various layers by a digital printing process. Mention will be made, for example, of the enamel jet technique which makes it possible to carry out accurate depositions and to obtain a resolution similar to that of printing via screen printing.

It is also possible to deposit the layers and especially the layer based on copper paste and/or the protective enamel layer by a spraying technique. The copper strip is completely encapsulated in a protective enamel layer. One of the advantages of the invention is especially to be able to carry out the deposition of the copper layers with techniques that are less accurate than screen printing or digital printing.

The steps of depositing the layers of copper and/or silver pastes may be carried out so as to form printed patterns on the portion of the glass sheet on which they are performed.

The step of firing the deposited layers is carried out in air. The process according to the present invention makes it possible to avoid the need to carry out the heat treatment under a controlled atmosphere, which would require the use of specific furnaces. The copper, protected by the enamel layer, undergoes no, or extremely little, oxidation during the firing step.

The process according to the invention may comprise a step of depositing an enamel layer on the face of the sheet prior to the deposition of the copper and/or silver layers. This enamel layer then comprises one or more glass frit(s) to enable the adhesion to the glass sheet and an opacifying pigment in order to mask the conductive stack.

The process according to the invention makes it possible to obtain copper layers having resistances comparable to those of silver. During aging tests, the copper strips protected by the enamel layer are not damaged.

The glazing according to the present invention may have applications in all of the fields where silver is applied to glass for its electrical conduction properties. A portion of the silver may be replaced by copper. Mention will be made, for example, of vehicle glazing deicing networks: the busbars may advantageously be made of copper, provided that the copper strips are covered with a protective enamel layer. It can also be envisaged to replace the power supply busbars of heated windshields, rain sensors, or antennae with a deposition made of copper.

The glazing according to the invention may find applications in various fields. Mention may be made, for example, of radiant heaters, induction hobs, food warmers or photovoltaic collectors.

Thus, the glazing according to the invention is such that a portion of its face comprises collector strips or resistance strips obtained from the electrically conductive composition based on copper paste and that are covered with the protective enamel layer. Preferably, the copper resistance strips are directly deposited on the glass sheet and are covered with a pigment-free protective enamel layer. Indeed, these resistance strips are generally thinner than the conductive strips and it may be esthetically advantageous to cover them with a colorless enamel layer.

The present invention also relates to heated windshields, rain sensors, antennae, radiant heaters, induction hobs, food warmers or photovoltaic collectors comprising a glazing as described above.

Figure 5:
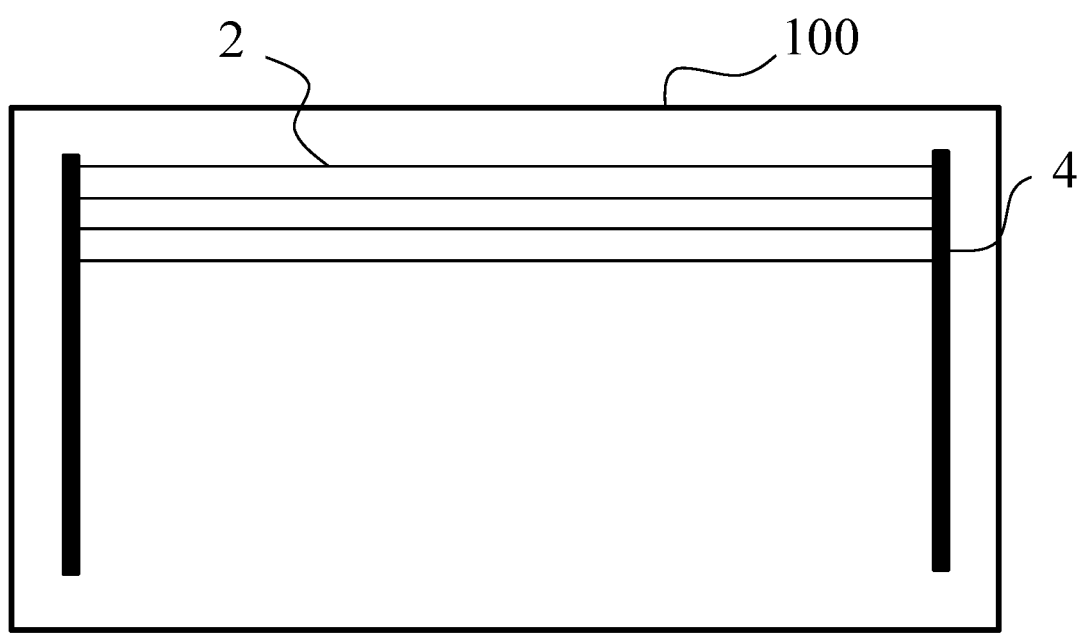
FIG. 5 illustrates a glazing 100 including a heating network 110.

Referring to FIG. 5, this figure shows a glazing 100 that includes a heating network. The heating network includes a series of narrow resistance strips 2 made of copper that are screen printed onto the surface of the glazing 100. The resistance strips 2 open into a wider collector strip 4 made of silver.

Figure 1:
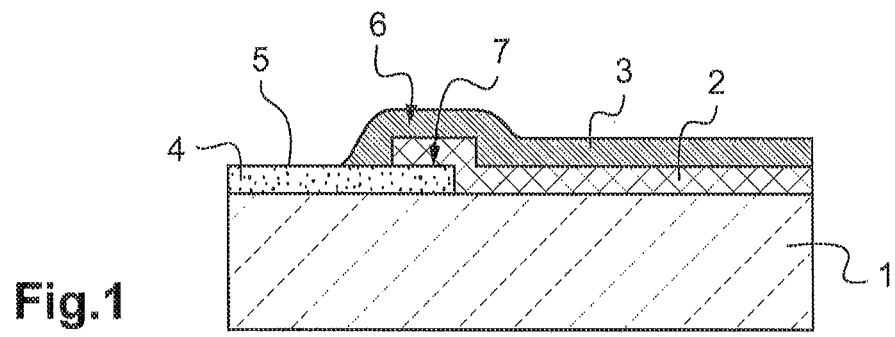
FIGS. 1 to 4 illustrate the invention and represent transverse cross sections of glazings according to the present invention.

In FIG. 1, the glass sheet (1) is covered with a silver strip (4) and with a copper strip (2). These two strips are directly deposited on the glass sheet. The silver strip is deposited first, and secondly the copper strip is deposited so as to partially cover the silver strip. The whole of the copper strip (2) is covered by a protective enamel layer (3). This layer (3) also extends over a portion of the silver strip (4) so as to create an enamel overlap zone (6) of the contact zone (7) between the silver strip and the copper strip. This configuration makes it possible to leave a portion of the silver strip not covered by the enamel layer (3). This is the zone (5) which forms the zone for welding the contact terminals. Usually, these terminals are welded to a single silver layer. Despite the stack of two screen-printed layers (copper strip and protective enamel), the welding zone remains similar to that which is found in customary electrical networks, i.e. that only comprise strips obtained from an electrically conductive composition based on silver paste.

Figure 2:
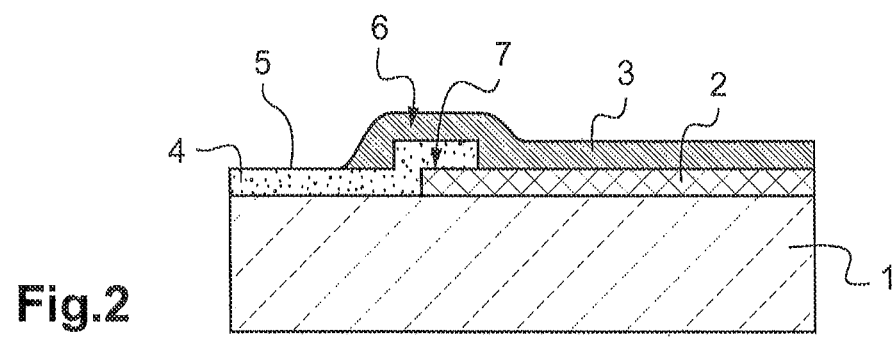

In FIG. 2, the glass sheet (1) is also covered with a silver strip (4) and with a copper strip (2) and the copper strip (2) is the one that is deposited first. The silver strip (4) is then deposited and partially covers the copper strip. The portion of the copper strip not covered by the silver strip is then protected by the protective enamel layer.

Figure 3:
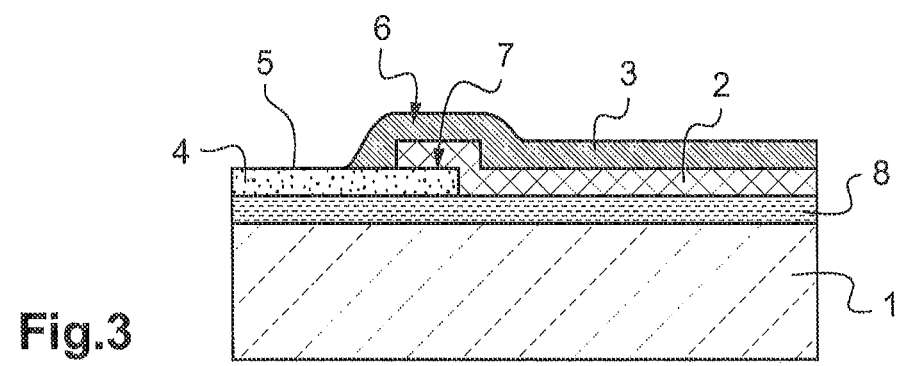

FIG. 3 represents the transverse cross section of a glazing on the face of which an enamel layer (8) is deposited. The copper strip (2) and silver strip (4) are deposited with the same configuration as that described in FIG. 1, directly on an enamel layer (8). The protective enamel layer (3) is deposited on the copper strip, which is thus completely encapsulated and not visible in the glazing. The welding zone (5) remains easily accessible and consists only of the silver strip (4).

Figure 4:
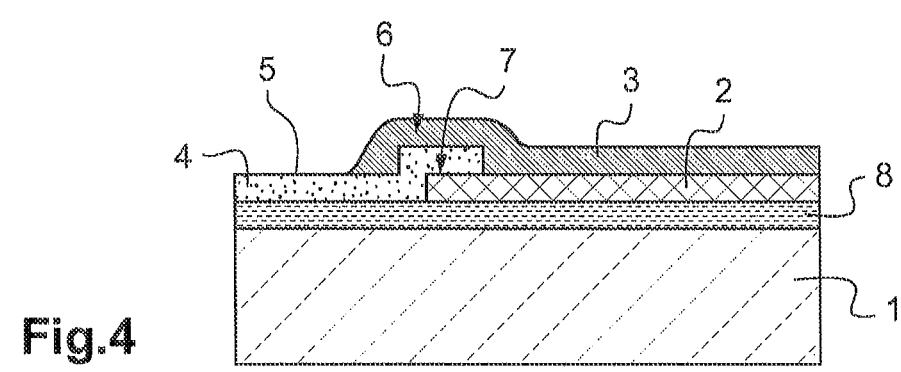

FIG. 4 represents the transverse cross section of a glazing on the face of which an enamel layer (8) is deposited, the copper and silver strips being deposited according to the same configuration as that described in FIG. 2.

The enamel layer (8) is a layer that inevitably comprises at least one glass frit to enable a good adhesion to the glass.

The invention claimed is:

1. A glazing comprising at least one glass sheet provided on a face thereof with an electrical network consisting of resistance strips and collector strips, said resistance strips being copper strips obtained from an electrically conductive composition comprising a copper paste and said resistance strips extending along a length of the at least one glass sheet and opening into said collector strips, said collector strips being wider than said resistance strips, wherein at least one portion of the face comprises at least one silver strip obtained from an electrically conductive composition comprising a silver paste, said at least one silver strip being in contact with at least one copper strip of the copper strips obtained from the electrically conductive composition comprising a copper paste, said at least one silver strip forming one of said collector strips, wherein each of said copper strips obtained from the electrically conductive composition comprising the copper paste is completely covered with a pigment-free protective enamel layer so that the copper strips are provided between the at least one glass sheet and the pigment-free protective enamel layer, the pigment-free protective enamel layer covering only a portion of the at least one silver strip, said portion corresponding to an interface zone between the at least one copper strip and the at least one silver strip.

2. The glazing as claimed in claim 1, wherein the contact between the at least one copper strip and the at least one silver strip is made at an end of the at least one copper strip obtained from the electrically conductive composition comprising the copper paste.

3. The glazing as claimed in claim 1, wherein the at least one copper strip partially covers the at least one silver strip.

4. The glazing as claimed in claim 1, wherein the at least one silver strip partially covers the at least one copper strip.

5. The glazing as claimed in claim 1, wherein the copper strips and/or the at least one silver strip are positioned on an enamel layer deposited on the glass sheet.

6. The glazing as claimed in claim 5, wherein the electrically conductive composition comprising the copper paste comprises between 70% and 90% by weight of copper powder and less than 15% by weight of glass frit.

7. The glazing as claimed in claim 1, wherein a thickness, measured after firing, of the copper strips comprising the copper paste is between 5 and 50 µm.

8. The glazing as claimed in claim 1, wherein the protective enamel layer covering the copper strips has a thickness, measured after firing, of between 5 and 40 µm.

9. The glazing as claimed in claim 7, wherein the thickness, measured after firing, of the copper strips comprising the copper paste is between 5 and 30 µm.

10. The glazing as claimed in claim 8, wherein the protective enamel layer covering the copper strips has a thickness, measured after firing, of between 10 and 30 µm.

11. The glazing as claimed in claim 1, wherein the pigment-free protective enamel layer covering the copper strips is exposed to an outside environment.

* * * * *